United States Patent
Lyons et al.

[11] Patent Number: 5,930,645
[45] Date of Patent: Jul. 27, 1999

[54] SHALLOW TRENCH ISOLATION FORMATION WITH REDUCED POLISH STOP THICKNESS

[75] Inventors: Christopher F. Lyons, Fremont, Calif.; Basab Bandyopadhyay, Austin, Tex.; Nick Kepler, Saratoga, Calif.; Olov Karlsson; Larry Wang, both of San Jose, Calif.; Effiong Ibok, Sunnyvale, Calif.

[73] Assignee: Advanced Micro Devices, Inc., Sunnyvale, Calif.

[21] Appl. No.: 08/993,881

[22] Filed: Dec. 18, 1997

[51] Int. Cl.⁶ ............................................. H01L 21/76
[52] U.S. Cl. ........................... 438/424; 438/425; 438/426
[58] Field of Search ................................. 438/424, 426, 438/425

[56] References Cited

U.S. PATENT DOCUMENTS

| | | | |
|---|---|---|---|
| 3,721,584 | 3/1973 | Diem | 359/580 |
| 4,697,089 | 9/1987 | Drage | 250/559.31 |
| 5,217,920 | 6/1993 | Mattox et al. | 438/425 |
| 5,229,316 | 7/1993 | Lee et al. | 438/424 |
| 5,455,194 | 10/1995 | Vasquez et al. | 438/427 |
| 5,506,168 | 4/1996 | Morita et al. | 438/424 |
| 5,536,675 | 7/1996 | Bohr | 438/427 |
| 5,578,518 | 11/1996 | Koike et al. | 438/424 |
| 5,712,185 | 1/1998 | Tsai et al. | 438/424 |
| 5,721,172 | 2/1998 | Jang et al. | 438/424 |
| 5,763,315 | 6/1998 | Benedict et al. | 438/424 |
| 5,776,808 | 7/1998 | Muller et al. | 438/243 |

*Primary Examiner*—Peter Toby Brown
*Assistant Examiner*—Maria Guerrero

[57] ABSTRACT

An insulated trench isolation structure is formed in a semiconductor substrate using a thin amorphous silicon or polysilicon polish stop layer by adding a reflectance compensation layer on the polish stop layer. As a result, the topological step between the main surface of the substrate and the uppermost surface of the trench fill is reduced, thereby facilitating the application and enhancing the accuracy of photolithographic techniques in forming features with minimal dimensions.

17 Claims, 3 Drawing Sheets

SHALLOW TRENCH ISOLATION FORMATION WITH REDUCED POLISH STOP THICKNESS

FIELD OF THE INVENTION

The present invention relates to a method of manufacturing a semiconductor device comprising trench isolation. The invention has particular applicability in manufacturing high density semiconductor devices with submicron design features and active regions isolated by shallow insulated trenches.

BACKGROUND ART

Current demands for high density and performance associated with ultra large scale integration require submicron features of about 0.25 microns and under, increased transistor and circuit speeds and improved reliability. Such demands for increased density, performance and reliability require formation of device features with high precision and uniformity.

Conventional semiconductor devices comprise a substrate and various electrically isolated regions, called active regions, in which individual circuit components are formed. The electrical isolation of these active regions is typically accomplished by thermal oxidation of the semiconductor substrate, typically monocrystalline silicon or an epitaxial layer formed thereon, bounding the active regions.

One type of isolation structure is known as trench isolation, wherein shallow trenches are etched in the substrate and an oxide liner is thermally grown on the trench walls. The trench is then refilled with an insulating material. The resulting structure is referred to as a shallow trench isolation (STI) structure. The active region typically comprises source/drain regions formed in the semiconductor substrate by implantation of impurities, spaced apart by a channel region on which a gate electrode is formed with a gate oxide layer therebetween. The gate electrode controls the turn-on and turn-off of each transistor.

A typical method of trench formation comprises initially growing a pad oxide layer on the substrate, and depositing a nitride polish stop layer thereon. A photoresist mask is then applied to define the trench areas. The exposed portions of the nitride layer are then etched away, followed by the pad oxide layer. The etching continues into the substrate to form the shallow trench. When etching of the trench is completed, the photoresist is stripped off the nitride layer.

Next, the substrate is oxidized to form an oxide liner on the walls and base of the trench to control the silicon-silicon dioxide interface quality. The trench is then refilled with an insulating material (or "trench fill"), such as silicon dioxide derived from tetraethyl orthosilicate (TEOS). The surface is then planarized, as by chemical-mechanical polishing (CMP) using the nitride layer as a polish stop, and the nitride and pad oxide are stripped off the active areas to complete the trench isolation structure.

When creating the STI structure, it is considered ideal for the uppermost surface of the substrate to be flush (i.e., coplanar) with the uppermost surface of the trench fill, in order to provide a flat topography for subsequent processing, particularly photolithographic processing, thereby facilitating accurate formation of submicron features, particularly features of about 0.25 microns and under. However, substantial planarity is difficult to achieve. For example, the use of a nitride layer as a polish stop results in the undesirable formation of a step.

FIG. 1A illustrates the substrate 1, pad oxide layer 2, nitride polish stop layer 3, oxide liner 4 and insulating material 5. Planarization is implemented utilizing nitride layer 3 as a polish stop (FIG. 1B). The nitride layer 3 and pad oxide layer 2 are then stripped off (FIG. 1C), creating a step between the main surface 1a of substrate 1 and the uppermost surface 5a of the insulating material 5. The height of the step substantially corresponds to the combined thicknesses of the pad oxide layer R and the nitride polish stop layer S. The use of nitride polish stop layer 3 undesirably increases the height of the topographical step, adversely impacting planarity at the interface of substrate surface 1a and trench fill surface 5a. Such a topographical step renders it difficult to photolithographically process subsequent layers of the device with accuracy, particularly in forming submicron features, thereby adversely affecting process yield and production cost. This problem becomes more acute as circuit geometry is continuously reduced to the 0.25 micron and under regime.

Unfortunately, the thickness S of the nitride layer 3, typically about 1600 Å to about 1800 Å, cannot be reduced to the minimum necessary for it to function effectively as a polish stop (typically between about 300 Å and about 1000 Å depending on variables in the polishing process), because its thickness is optimized for photolithographic processing in defining the source/drain mask which, in turn, defines the trench areas. Accurate photolithographic processing requires that the nitride layer 3 on which the mask is formed have a specific optical reflectivity which, in turn, requires the nitride layer 3 to have a thickness greater than that necessary for it to function as a polish stop. Furthermore, any change in the thickness of the nitride layer 3 must be made in quantum increments; e.g., 400 Å either thicker or thinner at a time, because of the nature of its optical properties. It is therefore difficult to optimize the thickness S of the nitride layer 3 as to its polish stop function without adversely impacting subsequent photolithographic processing.

In copending application Ser. No. 08/993,859, filed Dec. 18, 1997 (Attorney Docket No. 1033-294), a method is disclosed for forming trench isolation wherein the thickness of the nitride polish stop layer is reduced vis-a-vis conventional practices, thereby reducing the topological step between the main surface of the semiconductor substrate and the uppermost surface of the trench fill. The disclosed methodology comprises forming, on the pad oxide layer, a nitride layer whose thickness is optimized for its function as a polish stop (i.e., between about 300 Å and about 1000 Å), then forming a reflectance compensation layer, such as silicon dioxide, on the nitride polish stop layer. The photoresist source/drain mask is formed on the reflectance compensation layer by a photolithographic process. The thickness of the reflectance compensation layer is such that the combined optical path length of the nitride polish stop layer and the reflectance compensation layer is about equal to the optical path length required by the photolithographic process, optical path length being the product of a material's index of refraction and its thickness. The trench is thereafter etched and filled with an insulating material, then the insulating material and the reflectance compensation layer are planarized, as by CMP.

With the provision of a reflectance compensation layer, the methodology disclosed in copending application Ser. No. 08/993,859 (Attorney Docket No. 1033-294) reduces the thickness of the nitride polish stop layer compared to conventional practices, thereby reducing the height of undesirable topological steps at the substrate/trench interface. However, this methodology is limited to reducing the step height only to the minimum thickness required for the nitride polish stop to perform its function; i.e., about 300 Å.

There exists a continuing need for a method of manufacturing a semiconductor device which enables further reduction in the topographical step between the uppermost surface of the substrate or epitaxial layer and the uppermost surface of the trench, without adversely affecting photolithographic processing of the source/drain mask.

SUMMARY OF THE INVENTION

An object of the present invention is a method of manufacturing a semiconductor device having an insulated trench formed in a semiconductor substrate with improved flatness of the uppermost trench/substrate interface, thereby improving the accuracy of subsequent photolithographic processing.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a semiconductor device having an insulated trench formed in a semiconductor substrate or in an epitaxial layer on the semiconductor substrate, which method comprises: forming a pad oxide layer on a main surface of the substrate or epitaxial layer; forming a polish stop layer on the pad oxide layer, the polish stop layer comprising polysilicon or amorphous silicon and having a first thickness such that damage to the pad oxide layer does not occur during subsequent polishing, the polish stop layer having an upper surface and a first optical path length proportional to the first thickness; forming a reflectance compensation layer on the upper surface of the polish stop layer to a second thickness, the reflectance compensation layer having a second optical path length proportional to the second thickness; and forming a mask having an opening on the reflectance compensation layer by a photolithographic process; wherein the reflectance compensation and polish stop layers have a combined optical path length about equal to that required by the photolithographic process.

Another aspect of the present invention is a method of manufacturing an integrated circuit on a semiconductor substrate, comprising: forming a silicon dioxide pad layer on a main surface of the substrate or an epitaxial layer formed on the substrate; forming a polish stop layer on the silicon dioxide pad layer, the polish stop layer comprising amorphous silicon or polysilicon deposited by low pressure chemical vapor deposition (LPCVD) to a first thickness such that damage to the silicon dioxide pad layer does not occur during polishing, the polish stop layer having an upper surface and a first optical path length equal to the product of the first thickness and an index of refraction of the polish stop layer; forming a silicon dioxide reflectance compensation layer on the upper surface of the polish stop layer to a second thickness, the reflectance compensation layer having a second optical path length equal to the product of the second thickness and an index of refraction of the reflectance compensation layer, and comprising silicon dioxide derived from tetraethyl orthosilicate (TEOS) by LPCVD, silicon dioxide derived from silane by LPCVD, silicon dioxide thermally grown, or silicon oxynitride; forming a photoresist mask having an opening on the reflectance compensation layer by a photolithographic process, wherein the reflectance compensation layer and polish stop layer have a combined optical path length about equal to that required by the photolithographic process; etching to remove portions of the underlying reflectance compensation layer, polish stop layer and silicon dioxide pad layer and to form a trench in the substrate or epitaxial layer at a depth of up to about 4000 Å; removing the mask; thermally growing a thin silicon oxide liner on an internal surface of the trench and in contact with the silicon dioxide pad layer by heating to a temperature of at least about 1000° C. depositing an insulating material filling the trench, the insulating material comprising silicon dioxide derived from tetraethyl orthosilicate (TEOS) by LPCVD, silicon dioxide derived from silane by LPCVD, or a high density plasma oxide; and chemical-mechanical polishing such that an upper surface of the insulating material is substantially flush with the upper surface of the polish stop layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1A:
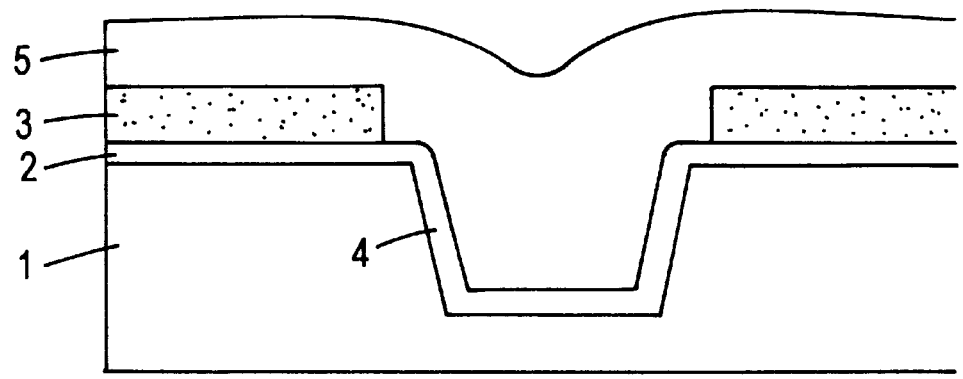
FIGS. 1A–1C schematically illustrate sequential phases of a method of STI formation which results in a large topography between the insulating material and the main surface of the substrate.
Figure 1B:
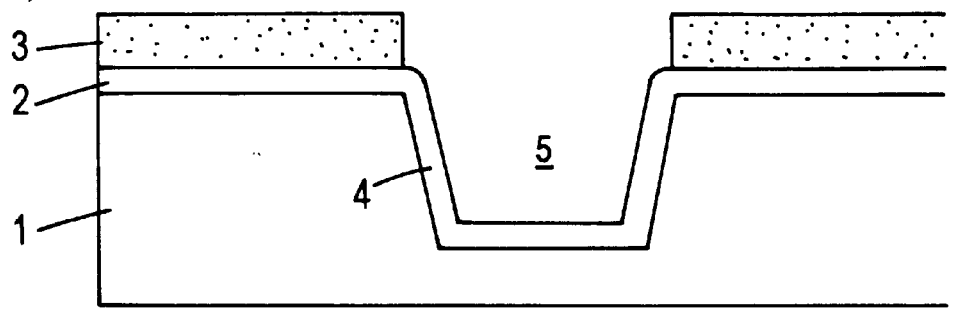
Figure 1C:
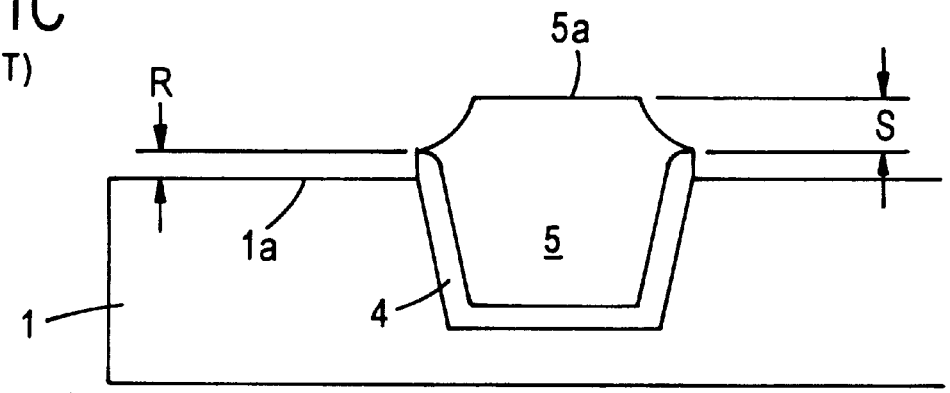

The present invention constitutes an improvement over the methodology disclosed in copending application Ser. No. 08/993,859 (Attorney Docket No. 1033-294) by acheiving greater advantages by replacing the nitride polish stop with a material, such as amorphous silicon or polysilicon, which has superior polish stop properties to nitride, thereby enabling the inventive polish stop layer to be formed to a thickness less than the minimum thickness of a nitride polish stop layer, thus further reducing the height of topographical steps at the substrate/trench interface. Such topographical steps severely limit the capability of conventional photolithographic techniques in forming features with fine dimensions; e.g., less than about $0.25\mu$, particularly less than about $0.18\mu$. The present invention enables the manufacture of semiconductor devices with a reduction in the height of such undesirable topographical steps at the substrate/trench interface.

According to the methodology of the present invention, an amorphous silicon or polysilicon polish stop layer having a reduced thickness vis-a-vis conventional practices is formed on a pad oxide layer which, in turn, is formed on a main surface of a semiconductor substrate or an epitaxial layer on a semiconductor substrate. As used throughout the present disclosure and claims, the term "substrate" denotes a semiconductor substrate or an epitaxial layer formed on the semiconductor substrate. A reflectance compensation layer, such as silicon dioxide, is then deposited on the polish stop layer, and a photoresist source/drain mask is formed on the reflectance compensation layer.

The photolithographic process employed to create the source/drain mask typically requires the layer on which the mask is formed to exhibit certain optical properties, one of the most important being reflectance. A key parameter determining reflectance is optical path length, which denotes the thickness of a material at a given wavelength of light; i.e., how thick the layer on which the source/drain mask is formed appears at the wavelength at which the photolithographic process is conducted. Optical path length is the product of a material's refractive index and its thickness, and the optical path lengths of materials stacked on one another can be summed to obtain a total optical path length. The methodology of the present invention utilizes the characteristics of optical path length to enable the thickness of the polish stop layer to be drastically reduced vis-a-vis conventional practices and vis-a-vis copending application Ser. No. 08/993,859 (Attorney Docket No. 1033-294), by providing the reflectance compensation layer on the polish stop layer and by providing a polish stop layer comprising a suitable material, e.g. amorphous silicon or polysilicon, which has superior polish stop properties. The reflectance compensation layer has a thickness such that the sum of its optical path length and the optical path length of the polish stop layer is about equal to the optical path length required by the photolithographic process used to form the photoresist mask.

After masking, the substrate is etched to form a trench, an oxide liner is grown in the trench surface, and the trench is filled with an insulating material. The insulating material is then planarized, as by CMP, and the polish stop and pad oxide removed by etching, leaving a relatively small step between the insulating material and the main surface of the substrate.

The provision of the reflectance compensation layer enables the thickness of the polish stop layer to be reduced to a minimum to function effectively as a polish stop, and the use of amorphous silicon or polysilicon as a polish stop enables the inventive polish stop layer to be thinner than previously employed nitride polish stop layers, due to the superior polish stop characteristics of amorphous silicon and polysilicon. The reduction of the thickness of the polish stop reduces topographical steps, thereby enabling substantial planarization of the insulating material. The reduction in topographical steps enables application of subsequent layers with increased facility, and improves the accuracy of subsequent photolithographic processing, particularly with respect to minimal dimensions.

Figure 2A:
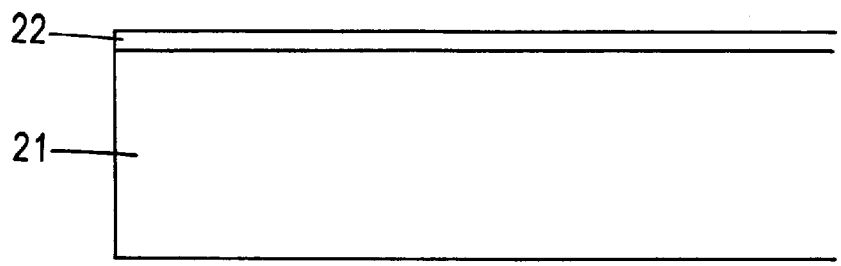
FIGS. 2A–2H schematically illustrate sequential phases of a method in accordance with an embodiment of the present invention.

An embodiment of the present invention is illustrated in FIGS. 2A–2H, wherein sequential phases in forming a semiconductor device in accordance with the present invention are depicted. Referring to FIG. 2A, substrate 21 is prepared having a substantially planar surface, typically a semiconductor substrate comprising doped monocrystalline silicon or an epitaxial layer formed on a semiconductor substrate in accordance with conventional practices. A pad oxide layer 22 is then grown on the substrate 21. Pad oxide layer 22 typically comprises silicon oxide and can be thermally grown on the substrate or deposited by chemical vapor deposition (CVD) to a suitable thickness; e.g., about 100 Å to about 200 Å. In another embodiment, a pad oxide containing a thinned thermally-grown silicon oxide layer and a buffer polycrystalline silicon layer is employed as the pad layer. Pad layer 22 functions as a buffer layer cushioning stresses between substrate 21 and subsequently applied layers. FIG. 2A illustrates silicon substrate 21 and the pad oxide layer 22.

Figure 2B:
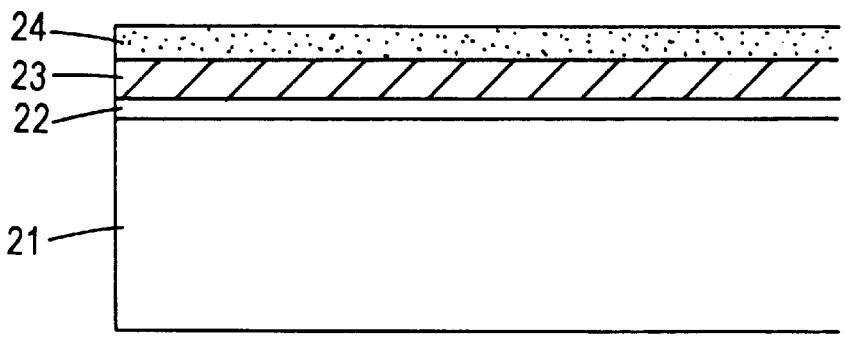

After formation of the pad oxide layer 22, a polish stop layer 23 is deposited on the pad oxide layer 22, as shown in FIG. 2B, such as an amorphous silicon layer by CVD or a polysilicon layer by CVD. A reflectance compensation layer 24 is formed on the polish stop layer 23, such as a transparent silicon dioxide layer derived from tetraethyl orthosilicate (TEOS) by low pressure chemical vapor deposition (LPCVD), silicon dioxide derived from silane by LPCVD, or thermally grown silicon dioxide. Alternatively, reflectance compensation layer 24 may comprise a translucent material which is absorptive at the exposure wavelength of the photolithography process, such as silicon oxynitride deposited by conventional methods, thus improving process control.

The thickness of polish stop layer 23 is chosen based on the required thickness for its function as a polish stop, depending on the variables of the polishing process. Additionally, the subsequent thermal growth of the oxide trench liner may cause partial consumption of the polish stop layer as oxygen diffuses through the reflectance compensation layer to react with the amorphous or polysilicon polish stop layer and form silicon dioxide. Thus, the thickness of the polish stop layer should be chosen such that after the liner oxidation step, the polish stop layer is at or above its minimum required thickness. The thickness of reflectance compensation layer 24 is chosen based on the thickness of polish stop layer 23 and the reflectance requirements of the photolithography process subsequently employed to form the source/drain mask.

Figure 2C:
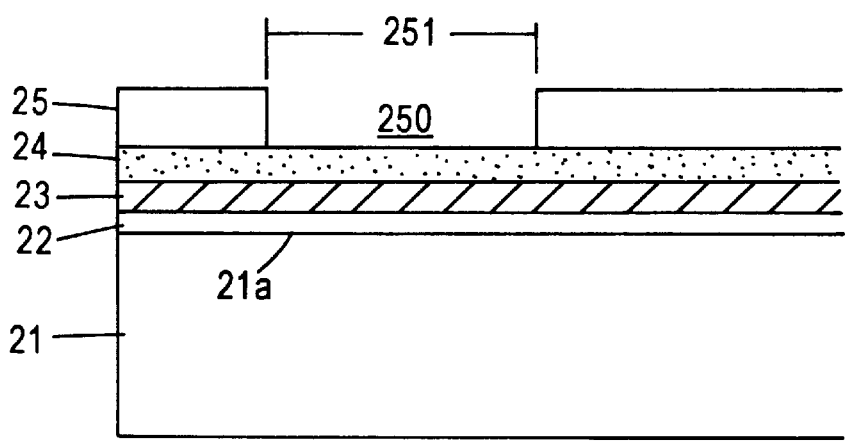
Figure 2D:
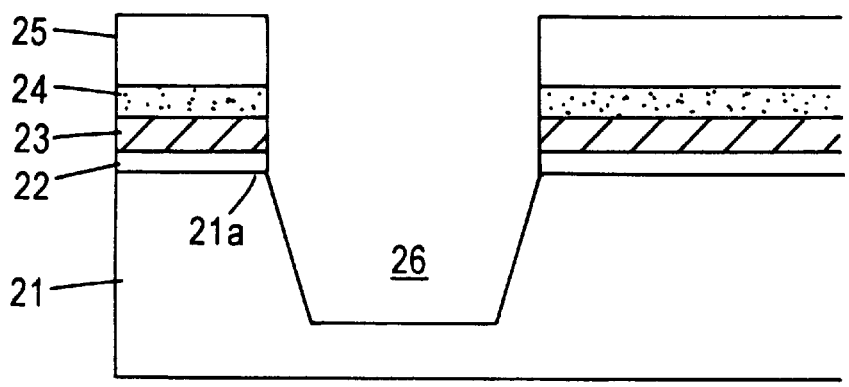

After formation of the reflectance compensation layer 24, photoresist mask 25 is formed on reflectance compensation layer 24, as shown in FIG. 2C. Photoresist mask 25 has a pattern defined by openings 250, which have a width 251 substantially corresponding to the width of the subsequently formed trench at the main surface 21a, such as about 0.25µ or less. The reflectance compensation layer 24 and polish stop layer 23 are then removed by etching, and etching continued through the pad oxide layer 22 and into the substrate 21 to form the shallow trench 26, as shown in FIG. 2D. The trench 26 is typically etched to a depth of up to about 4000 Å; e.g., about 2500 Å to about 3000 Å. After etching trench 26, photoresist 25 is stripped off the reflectance compensation layer 24.

Figure 2E:
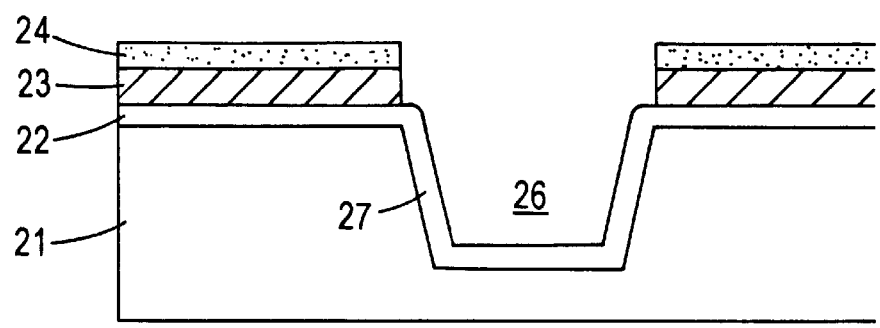
Figure 2F:
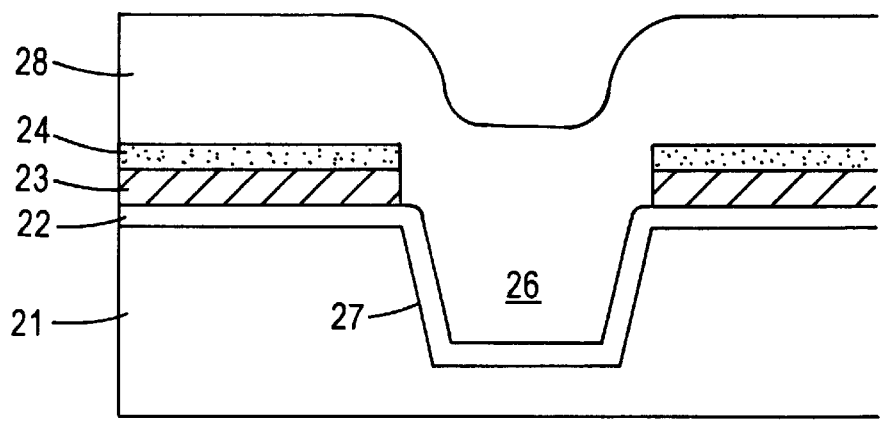
Figure 2G:
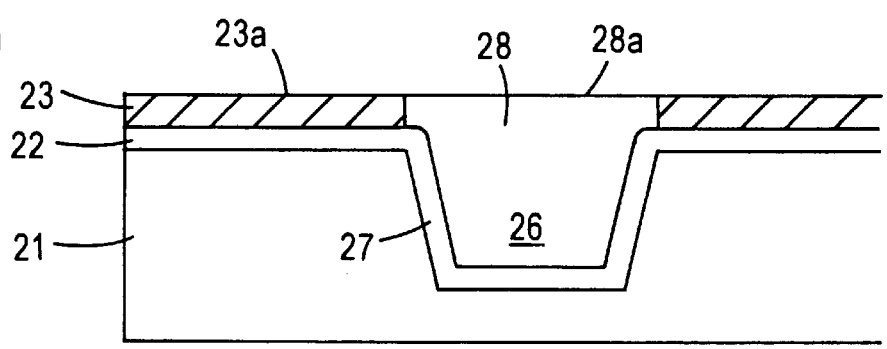
Figure 2H:
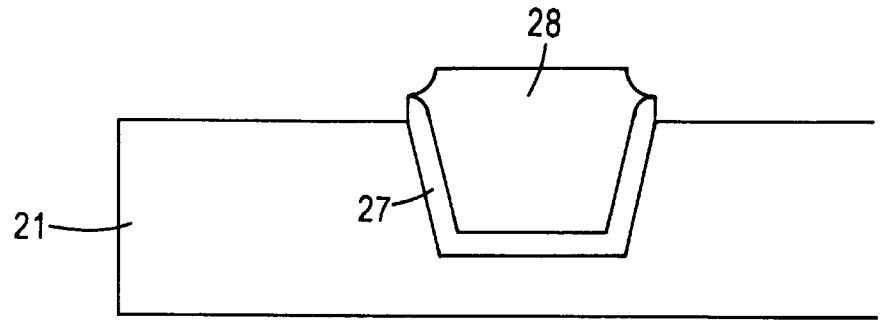

Thereafter, the trench surface is thermally oxidized to form an oxide liner 27 on the inner surface of trench 26 and in contact with the pad oxide layer 22, typically at a temperature of at least about 1000° C. FIG. 2E shows the trench 26 with the completed liner 27. Subsequent to formation of the oxide liner 27, trench 26 is filled with a suitable insulating material 28, as shown in FIG. 2F. Such insulating material can comprise silicon dioxide derived from TEOS by LPCVD or derived from silane by LPCVD. The trench 26 can also be filled with a high density plasma (HDP) oxide, preferably employing the methodology disclosed in copending application Ser. No. 08/924,133, filed Sep. 5, 1997, the entire disclosure of which is hereby incorporated herein by reference. Subsequent to trench filling, planarization is effected, as by CMP, such that an upper surface 28a of the insulating material 28 is substantially flush with an upper surface 23a of the polish stop 23, as shown in FIG. 2G. The polish stop layer 23 and the pad oxide layer 22 are then stripped off, leaving the completed STI structure shown in FIG. 2H.

The trench isolation structure formed in accordance with the present invention enables formation of an STI structure using a thin amorphous silicon or polysilicon layer as a polish stop, thereby enabling the uppermost surface of the STI structure to be substantially coplanar with the main surface of the semiconductor substrate vis-a-vis conventional STI processes and vis-a-vis the process disclosed in copending application Ser. No. 08/993,859 (Attorney Docket No. 1033-294). The present invention enables a reduction in the topography step between the insulating material and the main surface of the substrate, thereby significantly improving planarity. As a result, subsequent layers can be applied with greater facility and subsequent photolithographic processing performed with greater accuracy. The present invention is applicable to the manufacture of various types of semiconductor devices having STI, particularly high density semiconductor devices having a design rule of about $0.25\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device having an insulated trench formed in a semiconductor substrate or in an epitaxial layer on the semiconductor substrate, which method comprises:

forming a pad oxide layer on a main surface of the substrate or epitaxial layer;

forming a polish stop layer on the pad oxide layer, the polish stop layer comprising polysilicon or amorphous silicon and having a first thickness, an upper surface and a first optical path length proportional to the first thickness;

forming a reflectance compensation layer on the upper surface of the polish stop layer to a second thickness, the reflectance compensation layer having a second optical path length proportional to the second thickness; and forming a mask having an opening on the reflectance compensation layer by a photolithographic process;

wherein the first thickness is about the minimum thickness such that damage to the pad oxide layer does not occur during subsequent polishing; and wherein the reflectance compensation and polish stop layers have a combined optical path length about equal to that required by the photolithographic process.

2. The method according to claim 1, wherein the pad oxide layer comprises silicon dioxide having a thickness of about 100 Å to about 200 Å.

3. The method according to claim 1, wherein the reflectance compensation layer comprises silicon dioxide derived from tetraethyl orthosilicate (TEOS) by low pressure chemical vapor deposition (LPCVD), silicon dioxide derived from silane by LPCVD, silicon dioxide thermally grown, or silicon oxynitride.

4. The method according to claim 1, wherein the mask comprises a photoresist mask.

5. The method according to claim 1, wherein the first optical path length is equal to the product of the first thickness and an index of refraction of the polish stop layer, and the second optical path length is equal to the product of the second thickness and an index of refraction of the reflectance compensation layer.

6. The method according to claim 1, wherein the polish stop layer is deposited by low pressure chemical vapor deposition.

7. The method according to claim 1, which method further comprises:

etching to remove portions of the underlying reflectance compensation layer, polish stop layer and pad oxide layer and to form the trench in the substrate or epitaxial layer;

removing the mask;

depositing an insulating material filling the trench;

planarizing such that an upper surface of the insulating material is substantially flush with the upper surface of the polish stop layer; and etching to remove the polish stop layer and pad oxide layer.

8. The method according to claim 7, comprising, prior to depositing the insulating material, heating at a temperature of at least about 1000° C. to thermally grow a silicon oxide liner on an internal surface of the trench and in contact with the pad oxide layer.

9. The method according to claim 7, wherein the insulating material comprises silicon dioxide derived from tetraethyl orthosilicate (TEOS) by low pressure chemical vapor deposition (LPCVD), silicon dioxide derived from silane by LPCVD, or a high density plasma oxide.

10. The method according to claim 7, wherein the opening in the mask has a width substantially equal to a width of the trench at the main surface.

11. The method according to claim 9, comprising polishing by chemical-mechanical polishing.

12. The method according to claim 10, wherein the width of the opening is about $0.25\mu$ or under.

13. The method according to claim 12, wherein the trench is etched to a depth of up to about 4000 Å.

14. The method according to claim 13, wherein the trench is etched to a depth of about 2500 Å to about 3000 Å.

15. A method of manufacturing an integrated circuit on a semiconductor substrate, comprising:

forming a silicon dioxide pad layer on a main surface of the substrate or an epitaxial layer formed on the substrate;

forming a polish stop layer on the silicon dioxide pad layer, the polish stop layer comprising amorphous silicon or polysilicon deposited by low pressure chemical vapor deposition (LPCVD) to a first thickness such that damage to the silicon dioxide pad layer does not occur during polishing, the polish stop layer having an upper surface and a first optical path length equal to the product of the first thickness and an index of refraction of the polish stop layer;

forming a silicon dioxide reflectance compensation layer on the upper surface of the polish stop layer to a second thickness, the reflectance compensation layer having a second optical path length equal to the product of the second thickness and an index of refraction of the reflectance compensation layer, and comprising silicon dioxide derived from tetraethyl orthosilicate (TEOS) by LPCVD, silicon dioxide derived from silane by LPCVD, silicon dioxide thermally grown, or silicon oxynitride;

forming a photoresist mask having an opening on the reflectance compensation layer by a photolithographic process, wherein the reflectance compensation layer and polish stop layer have a combined optical path length about equal to that required by the photolithographic process;

etching to remove portions of the underlying reflectance compensation layer, polish stop layer and silicon dioxide pad layer and to form a trench in the substrate or epitaxial layer at a depth of up to about 4000 Å;

removing the mask;

thermally growing a thin silicon oxide liner on an internal surface of the trench and in contact with the silicon dioxide pad layer by heating to a temperature of at least about 1000° C.;

depositing an insulating material filling the trench, the insulating material comprising silicon dioxide derived from tetraethyl orthosilicate (TEOS) by LPCVD, silicon dioxide derived from silane by LPCVD, or a high density plasma oxide; and chemical-mechanical polishing such that an upper surface of the insulating material is substantially flush with the upper surface of the polish stop layer.

16. A method of manufacturing a semiconductor device having an insulated trench formed in a semiconductor substrate or in an epitaxial layer on the semiconductor substrate, which method comprises:

forming a pad oxide layer on a main surface of the substrate or epitaxial layer;

forming a polish stop layer on the pad oxide layer, the polish stop layer comprising a layer of a material having a greater resistance to chemical mechanical polishing than silicon nitride, having a first thickness such that damage to the pad oxide layer does not occur during subsequent chemical mechanical polishing, an upper surface, and a first optical path length proportional to the first thickness;

forming a reflectance compensation layer on the upper surface of the polish stop layer to a second thickness, the reflectance compensation layer having a second optical path length proportional to the second thickness; and forming a mask having an opening on the reflectance compensation layer by a photolithographic process;

wherein the reflectance compensation and polish stop layers have a combined optical path length about equal to that required by the photolithographic process.

17. The method according to claim 16, which method further comprises:

etching to remove portions of the underlying reflectance compensation layer, polish stop layer and pad oxide layer and to form the trench in the substrate or epitaxial layer;

removing the mask;

depositing an insulating material filling the trench;

planarizing such that an upper surface of the insulating material is substantially flush with the upper surface of the polish stop layer; and etching to remove the polish stop layer and pad oxide layer.

* * * * *